United States Patent
Kim et al.

(10) Patent No.: US 10,934,455 B2
(45) Date of Patent: Mar. 2, 2021

(54) POLYSILSESQUIOXANE RESIN COMPOSITION FOR FLEXIBLE SUBSTRATE

(71) Applicant: LTC CO., LTD, Gyeonggi-do (KR)

(72) Inventors: Jun Young Kim, Gyeonggi-do (KR); Hwa Young Kim, Gyeonggi-do (KR); Ho Sung Choi, Gyeonggi-do (KR)

(73) Assignee: LTC CO., Ltd.

( * ) Notice: Subject to any disclaimer, the term of this patent is extended or adjusted under 35 U.S.C. 154(b) by 160 days.

(21) Appl. No.: 16/067,512

(22) PCT Filed: Dec. 29, 2016

(86) PCT No.: PCT/KR2016/015491
§ 371 (c)(1),
(2) Date: Jun. 29, 2018

(87) PCT Pub. No.: WO2017/116171
PCT Pub. Date: Jul. 6, 2017

(65) Prior Publication Data
US 2019/0023942 A1    Jan. 24, 2019

(30) Foreign Application Priority Data
Dec. 31, 2015 (KR) .................. 10-2015-0191064

(51) Int. Cl.
| | | |
|---|---|---|
| *C08L 83/06* | (2006.01) | |
| *C09D 183/06* | (2006.01) | |
| *C08K 5/5415* | (2006.01) | |
| *C08G 77/16* | (2006.01) | |
| *C09D 7/20* | (2018.01) | |
| *C08G 77/04* | (2006.01) | |
| *C08G 77/14* | (2006.01) | |
| *H05K 1/03* | (2006.01) | |
| *C09D 7/65* | (2018.01) | |
| *H01L 27/12* | (2006.01) | |
| *C08G 77/24* | (2006.01) | |
| *C08G 77/00* | (2006.01) | |

(52) U.S. Cl.
CPC ......... *C09D 183/06* (2013.01); *C08G 77/045* (2013.01); *C08G 77/14* (2013.01); *C08G 77/16* (2013.01); *C08K 5/5415* (2013.01); *C08L 83/06* (2013.01); *C09D 7/20* (2018.01); *H05K 1/0326* (2013.01); *C08G 77/24* (2013.01); *C08G 77/70* (2013.01); *C08G 2150/00* (2013.01); *C09D 7/65* (2018.01); *H01L 27/1218* (2013.01); *H01L 27/1266* (2013.01); *H05K 1/0393* (2013.01); *H05K 2201/0108* (2013.01); *H05K 2201/10128* (2013.01)

(58) Field of Classification Search
CPC ....... C09D 183/06; C08L 83/06; C08G 77/16; C08G 77/24; C08G 77/70
See application file for complete search history.

(56) References Cited

U.S. PATENT DOCUMENTS

| | | | | |
|---|---|---|---|---|
| 6,344,305 | B1* | 2/2002 | Lin ............... | G03F 7/0045 430/270.1 |
| 7,205,085 | B2* | 4/2007 | Nishimura ..... | G03F 7/001 430/190 |
| 2002/0076549 | A1* | 6/2002 | Welch ............ | C09D 4/00 428/332 |
| 2003/0193044 | A1* | 10/2003 | Henry ............ | C08G 18/675 252/582 |
| 2014/0146285 | A1* | 5/2014 | Otani ............. | C08F 230/08 351/159.61 |
| 2016/0107127 | A1* | 4/2016 | Lee ............... | C08G 77/20 96/4 |

FOREIGN PATENT DOCUMENTS

| | | |
|---|---|---|
| JP | H05-86193 | 4/1993 |
| JP | H05-230215 | 9/1993 |
| JP | H11-292971 | 10/1999 |
| JP | 2006-219570 | 8/2006 |
| JP | 2019-504159 | 2/2019 |
| KR | 10-2010-0097558 | 9/2010 |
| KR | 10-2010-0131312 | 12/2010 |
| KR | 10-2011-0016538 | 2/2011 |
| KR | 10-2013-0079292 | 7/2013 |
| KR | 10-1520793 | 5/2015 |
| WO | WO 2009/101753 | 8/2009 |
| WO | WO 2015/099443 | 7/2015 |

OTHER PUBLICATIONS

International Search Report prepared by the Korean Intellectual Property Office dated Apr. 11, 2017, for International Application No. PCT/KR2016/015491.
"Solvent for Silicone Resin," Jun. 30, 2012, Introduction to Silicone Resin, p. 93, 3.7.3, with English Translation, 2 pages.
Official Action with English Translation for China Patent Application No. 201680077335.0, dated Aug. 5, 2020, 21 pages.

* cited by examiner

*Primary Examiner* — Margaret G Moore
(74) *Attorney, Agent, or Firm* — Sheridan Ross P.C.

(57) ABSTRACT

The present invention relates to a polysilsesquioxane resin composition for a flexible substrate. More specifically, the present invention relates to a polysilsesquioxane resin composition for a flexible substrate, having excellent heat resistance and transparency, the resin composition being usable for a flexible display substrate. More specifically, a transparent thin film can be formed, excellent transmittance is exhibited in the visible range even after curing, heat resistance is excellent, and flexibility and crack resistance can be controlled. Compared to a conventional polyimide-based substrate material, the present invention has excellent insulation characteristics and passivation characteristics, which can be satisfied simultaneously, and is advantageous for productivity since release characteristics are ensured during a delamination process from a glass substrate.

10 Claims, 1 Drawing Sheet

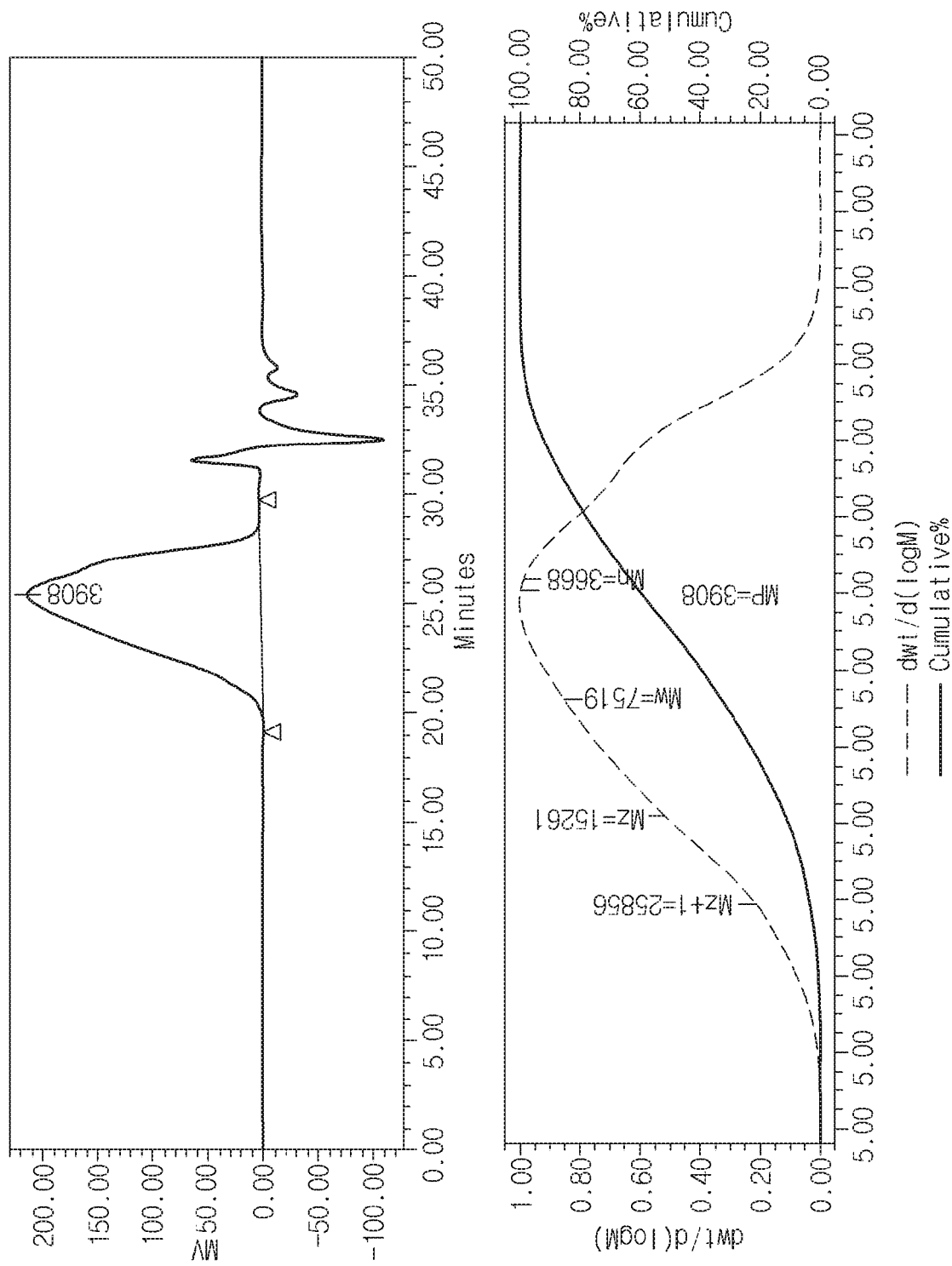

POLYSILSESQUIOXANE RESIN COMPOSITION FOR FLEXIBLE SUBSTRATE

CROSS REFERENCE TO RELATED APPLICATIONS

This application is a national stage application under 35 U.S.C. 371 and claims the benefit of PCT Application No. PCT/KR2016/015491 having an international filing date of 29 Dec. 2016, which designated the United States, which PCT application claimed the benefit of the Republic of Korea Patent Application No. 10-2015-0191064 filed 31 Dec. 2015, the disclosure of each of which are incorporated herein by reference.

TECHNICAL FIELD

The present invention relates to a polysilsesquioxane resin composition for a flexible substrate, and more particularly, to a polysilsesquioxane resin composition for a flexible substrate which has excellent heat resistance and excellent transparency, as a resin composition that may be used for a substrate of a flexible display.

BACKGROUND ART

Recently, in line with advances in flexible displays, electronic paper, and wearable devices, there has been an increasing need for high-performance substrate materials that support these advances. In particular, display products are further required to be lighter and thinner, but existing commercially available glass substrates are easily broken and it is difficult for these glass substrates to be made thinner and lighter.

Thus, to address these issues of existing glass substrates, various studies on application of polyimides as a material for a substrate have been conducted, but in spite of excellent thermal resistance, excellent insulation characteristics, and excellent flexibility thereof, polyimides have a dark color due to the interaction between pi-electrons according to a repetitive and regular phenyl structure, and thus transparency, which is a main characteristic for display applications, of such substrate material, is poor and the substrate material exhibits low solubility and insufficient processability.

In addition, a method of manufacturing a flexible substrate using an existing polyimide is performed by coating a lower carrier glass substrate with a polyimide precursor, forming a film by drying the coated glass substrate for a long period of time, subjecting the film to an ultra-thin-film transistor (TF) process, and then delaminating the film from the carrier glass substrate using a laser. However, when a flexible substrate is manufactured using this manufacturing method, yield is rapidly reduced.

Therefore, there is an urgent need to develop a novel polymer composition that is suitable for use in the manufacture of flexible substrates and has excellent heat resistance, excellent transparency, excellent processability, excellent delamination characteristics, excellent scratch resistance, and excellent passivation characteristics.

DISCLOSURE

Technical Problem

An object of the present invention is to provide a polysilsesquioxane resin composition for a flexible substrate.

Another object of the present invention is to provide a novel polysilsesquioxane resin composition having excellent resistance to high temperatures, excellent transparency, excellent delamination characteristics, excellent passivation characteristics, and excellent scratch resistance.

Still another object of the present invention is to provide a polysilsesquioxane resin composition including: a novel polysilsesquioxane random copolymer that may be used in flexible substrates; a cage-type polysilsesquioxane compound; a crosslinking agent; and an organic solvent.

Other objects and advantages of the present invention will become more apparent from the following detailed description and appended claims.

Technical Solution

Embodiments of the present invention are provided to more fully explain the present invention to those of ordinary skill in the art, and the embodiments set forth herein may be modified in many different forms and are not intended to limit the scope of the present invention. Rather, these embodiments are provided so that this disclosure will be more thorough and complete, and will fully convey the scope of the invention to those of ordinary skill in the art.

According to an embodiment of the present invention, there is provided a polysilsesquioxane random copolymer represented by Formula 1 below:

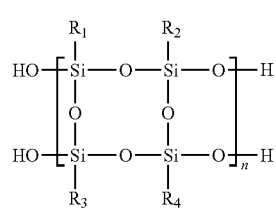

<Formula 1> wherein n is an integer of 2 to 100, $R_1$ to $R_4$ are one or more selected from the group consisting of a $C_{1-20}$ alkyl group, a $C_{2-20}$ alkylene group, a $C_{2-20}$ alkenyl group, a $C_{2-20}$ alkynyl group, a $C_{6-18}$ aryl group, a $C_{6-18}$ heteroaryl group, a $C_{6-18}$ cycloalkyl group, an amino group, a heterocycloalkyl group having 3 to 40 nuclear atoms, a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, and a succinic anhydride group, wherein the alkyl group, alkylene group, alkenyl group, alkynyl group, aryl group, heteroaryl group, cycloalkyl group, heterocycloalkyl group, and acryloxy group of $R_1$ to $R_4$ may be each independently substituted or unsubstituted with one or more substituents selected from the group consisting of a halogen, a hydroxyl group, —CN, a linear or branched $C_{1-6}$ alkyl, and a linear or branched $C_{1-6}$ alkoxy.

More particularly, in Formula 1, $R_1$ to $R_4$ are one or more selected from the group consisting of a $C_{1-20}$ alkyl group, a $C_{1-20}$ alkylene group, a $C_{1-20}$ alkenyl group, a $C_{1-20}$ alkynyl group, a $C_{6-18}$ aryl group, a $C_{6-18}$ heteroaryl group, a $C_{6-18}$ cycloalkyl group, an amino group, a heterocycloalkyl group having 3 to 40 nuclear atoms, a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, and a succinic anhydride group, and preferably, $R_1$ is $CF_3$—$(CF_2)_m$—, m is an integer of 0 to 18, $R_2$ is a $C_{2-20}$ alkylene group, and $R_4$ is one or more substituents selected from the group consisting of a glycidyloxy group, a cyclohexyl epoxy group, oxetane, acryloxy group, a methacryloxy group, an isocyanate group, a hydroxyl group, a phthalic anhydride group, a maleic anhydride group, and a succinic anhydride group.

More preferably, $R_1$ is one or more selected from the group consisting of trifluoromethyl, perflouropropyl, perfluorohexyl, perfluorooctyl, and perfluorodecyl, $R_2$ is intended for crack resistance and flexibility and is one or more selected from the group consisting of propyl, hexyl, octyl, and decyl, $R_3$ is intended for heat resistance and a high glass temperature $T_g$ and is one or more selected from the group consisting of a $C_{6-18}$ aryl group, a $C_{6-18}$ heteroaryl group, and a $C_{6-18}$ cycloalkyl group, and $R_4$ is intended for curing properties and is one or more selected from the group consisting of a glycidyloxy group, a cyclohexyl epoxy group, oxetane, an acryloxy group, a methacryloxy group, an isocyanate group, a hydroxyl group, a phthalic anhydride group, a maleic anhydride group, and a succinic anhydride group, but the present invention is not limited to the above examples.

The polysilsesquioxane random copolymer of Formula 1 is prepared by co-polymerizing two or more functional organosilane monomers by a sol-gel reaction, and is a random copolymer that is not limited to an arrangement order of the respective polymerization units. The functional organosilane monomers include a fluorine-based monomer, an epoxy-based monomer, a phenyl-based monomer, an alkyl-based monomer, and a cycloolefin-based monomer.

In one embodiment of the present invention, the random copolymer of the present invention has a weight average molecular weight ($M_w$) of 1,000 to 50,000 and a polydispersity index of 1.5 to 8.0.

According to an embodiment of the present invention, there is provided a polysilsesquioxane resin composition including: a polysilsesquioxane random copolymer represented by Formula 1 below; a compound represented by Formula 2 below; an organic solvent; and a crosslinking agent:

<Formula 1>

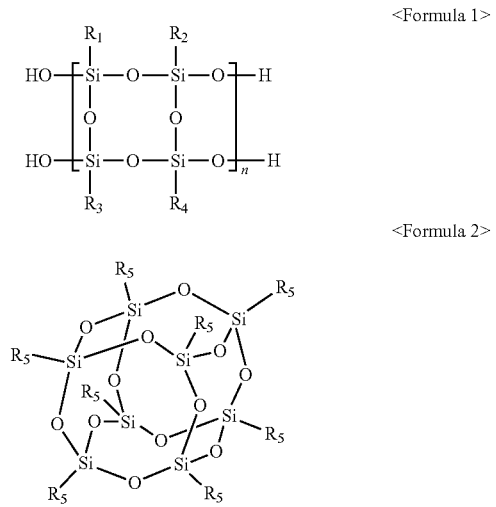

<Formula 2> wherein n is an integer of 2 to 100, $R_1$ to $R_4$ are one or more selected from the group consisting of a $C_{1-20}$ alkyl group, a $C_{2-20}$ alkylene group, a $C_{2-20}$ alkenyl group, a $C_{2-20}$ alkynyl group, a $C_{6-18}$ aryl group, a $C_{6-18}$ heteroaryl group, a $C_{6-18}$ cycloalkyl group, an amino group, a heterocycloalkyl group having 3 to 40 nuclear atoms, a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, and a succinic anhydride group, $R_5$ is one or more selected from the group consisting of a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, a succinic anhydride group, an amino group, and a carboxylic acid group, and the alkyl group, alkylene group, alkenyl group, alkynyl group, aryl group, heteroaryl group, cycloalkyl group, heterocycloalkyl group, and acryloxy group of $R_1$ to $R_5$ may be each independently substituted or unsubstituted with one or more substituents selected from the group consisting of a halogen, a hydroxyl group, —CN, a linear or branched $C_{1-6}$ alkyl, and a linear or branched $C_{1-6}$ alkoxy.

In particular, the compound of Formula 2 includes a substituent of $R_5$ to cause a curing reaction with the polysilsesquioxane random copolymer of Formula 1, and the substituent of $R_5$ is one or more selected from the group consisting of a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, a succinic anhydride group, an amino group, and a carboxylic acid group, but the present invention is not limited to the above examples. The heterocycloalkyl group and acryloxy group of $R_5$ may be each independently substituted or unsubstituted with one or more substituents selected from the group consisting of a halogen, a hydroxyl group, —CN, a linear or branched $C_{1-6}$ alkyl, and a linear or branched $C_{1-6}$ alkoxy. Generally, in the case of a polysilsesquioxane resin composition, cracks easily occur after curing. However, since the polysilsesquioxane resin composition of the present invention includes a cage-type compound such as the compound of Formula 2, the polysilsesquioxane resin composition provides a structure like nano-sized pores, and due to inclusion of the nano-sized pores, the polysilsesquioxane resin composition acts as buffer particles that prevent cracks from occurring. In the case of conventional polyimides, a separate buffer layer formed by inorganic deposition of a $SiO_x$ or $SiN_x$ layer as a passivation layer is required, whereas in the present invention, $SiO_x$ is used as a backbone, and thus has excellent compatibility with $SiO_x$ and $SiN_x$, which are used in the subsequent passivation process.

In addition, the polysilsesquioxane random copolymer of Formula 1 and the compound of Formula 2 can be cross-linked by heat, and thus heat resistance may be further enhanced. In addition, since the polysilsesquioxane resin composition includes the compound of Formula 2, when used in a material for a flexible substrate, suitable heat resistance, flexibility, and crack prevention characteristics may be achieved.

In one embodiment of the present invention, the cross-linking agent included in the polysilsesquioxane resin composition of the present invention includes one or more selected from the group consisting of a melamine-based compound, an acid anhydride-based compound, an isocyanate-based compound, an amine-based compound, an imidazole-based compound, a phenol-based compound, a hydroxyl-based compound, a carboxyl-based compound, and a mixture thereof, and more particularly, includes one or more selected from the group consisting of dicyandiamide, melamine, pyromellitic dianhydride, cyclobutane-1,2,3,4-tetracarboxylic dianhydride, 1,4,5,8-naphthalenetetracarboxylic dianhydride, benzophenone-3,3',4,4'-tetracarboxylic dianhydride, 3,3',4,4'-biphenyltetracarboxylic dianhydride, bicyclo[2.2.2]oct-7-ene-2,3,5,6-tetracarboxylic dianhydride, 1,2,4-benzenetricarboxylic acid, 4,4'-(9-fluorenylidene)diphenol, 4,4'-(1,3-adamantanediyl)diphenol, 4,4'-(hexafluoroisopropylidene)diphenol, and 4,4'-dihydroxybiphenyl, but the present invention is not limited to the above examples.

In one embodiment of the present invention, the organic solvent included in the polysilsesquioxane resin composition of the present invention is any one or more selected from the group consisting of diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, methyl isobutyl ketone, cyclohexanone, N-methyl-2-pyrrolidone (NMP), ethylene glycol dimethyl ether, diethylene glycol methyl ether, diethylene glycol ethyl ether, and dipropylene glycol methyl ether, but the present invention is not limited to the above examples.

In one embodiment of the present invention, the polysilsesquioxane resin composition of the present invention includes 5 wt % to 50 wt % of a polysilsesquioxane random copolymer represented by Formula 1 below, 1 wt to 30 wt % of a compound represented by Formula 2 below, 1 wt % to 10 wt % of a crosslinking agent, and 10 wt % to 92.9 wt % of an organic solvent:

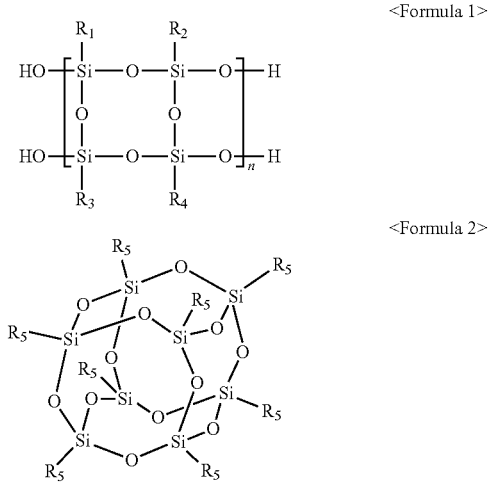

<Formula 1>

<Formula 2> wherein n is an integer of 2 to 100, $R_1$ to $R_4$ are one or more selected from the group consisting of a $C_{1-20}$ alkyl group, a $C_{2-20}$ alkylene group, a $C_{2-20}$ alkenyl group, a $C_{2-20}$ alkynyl group, a $C_{6-18}$ aryl group, a $C_{6-18}$ heteroaryl group, a $C_{6-18}$ cycloalkyl group, an amino group, a heterocycloalkyl group having 3 to 40 nuclear atoms, a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, and a succinic anhydride group, $R_5$ is one or more selected from the group consisting of a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, a succinic anhydride group, an amino group, and a carboxylic acid group, and the alkyl group, alkylene group, alkenyl group, alkynyl group, aryl group, heteroaryl group, cycloalkyl group, heterocycloalkyl group, and acryloxy group of $R_1$ to $R_5$ may be each, independently substituted or unsubstituted with one or more substituents selected from the group consisting of a halogen, a hydroxyl group, —CN, a linear or branched $C_{1-6}$ alkyl, and a linear or branched $C_{1-6}$ alkoxy.

In one embodiment of the present invention, the polysilsesquioxane resin composition of the present invention may further include a surfactant and a glycol-based solvent. The surfactant is used to improve leveling characteristics and coating stain properties of a film including the polysilsesquioxane resin composition of the present invention, and may be further included in an amount of 0.01 wt % to 10 wt %.

According to an embodiment of the present invention, there is provided an interlayer insulating film including the polysilsesquioxane resin composition of the present invention, wherein the interlayer insulating film may be used in a liquid crystal display device, an organic EL display device, a flexible display, or a touch panel, but the present invention is not limited thereto.

According to an embodiment of the present invention, there is provided a planarizing film including the polysilsesquioxane resin composition of the present invention, wherein the planarizing film may be used in a liquid crystal display device, an organic EL display device, a flexible display, or a touch panel, but the present invention is not limited thereto.

According to an embodiment of the present invention, there is provided a passivation insulating film including the polysilsesquioxane resin composition of the present invention, wherein the passivation insulating film may be used in a liquid crystal display device, an organic EL display device, a flexible display, or a touch panel, but the present invention is not limited thereto.

According to an embodiment of the present invention, there is provided a material for a substrate which includes the polysilsesquioxane resin composition of the present invention, wherein the material for a substrate may be used in a flexible display or a touch panel, but the present invention is not limited thereto.

Advantageous Effects

A polysilsesquioxane resin composition according to the present invention can form a transparent thin film, exhibits excellent transparency in a visible light region even after curing, and exhibits excellent heat resistance, and flexibility and crack resistance thereof is adjustable. Compared to existing polyimide-based substrate materials, the polysilsesquioxane resin composition can satisfy both excellent insulation properties and excellent passivation properties. In addition, the polysilsesquioxane resin composition can secure release properties in delamination from a glass substrate, thus being preferable in terms of productivity.

DESCRIPTION OF DRAWINGS

FIG. 1 illustrates a molecular weight of a polysilsesquioxane random copolymer of the present invention.

BEST MODE

According to an embodiment of the present invention, there is provided a polysilsesquioxane random copolymer represented by Formula 1 below:

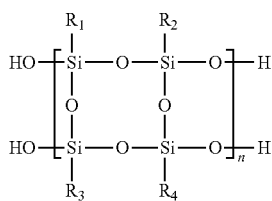

<Formula 1> wherein n is an integer of 2 to 100, $R_1$ to $R_4$ are one or more selected from the group consisting of a $C_{1-20}$ alkyl group, a $C_{2-20}$ alkylene group, a $C_{2-20}$ alkenyl group, a $C_{2-20}$ alkynyl group, a $C_{6-18}$ aryl group, a $C_{6-18}$ heteroaryl group, a $C_{6-18}$ cycloalkyl group, an amino group, a heterocycloalkyl group having 3 to 40 nuclear atoms, a glycidyloxy group, a cyclohexyl epoxy group, a $C_{3-10}$ heterocycloalkyl group, an acryloxy group, an isocyanate group, a hydroxyl group, a phthalic anhydride group, a maleic anhydride group, and a succinic anhydride group, and the alkyl group, alkylene group, alkenyl group, alkynyl group, aryl group, heteroaryl group, cycloalkyl group, heterocycloalkyl group, and acryloxy group of $R_1$ to $R_4$ may be each independently substituted or unsubstituted with one or more substituents selected from the group consisting of a halogen, a hydroxyl group, —CN, a linear or branched $C_{1-6}$ alkyl, and a linear or branched $C_{1-6}$ alkoxy.

Mode of the Invention

Hereinafter, the present invention will be described in further detail with reference to the following examples. It will be obvious to those of ordinary skill in the art that these examples are provided for illustrative purposes only and are not intended to limit the scope of the present invention according to the essence of the invention.

Synthesis Example 1

Synthesis of Polysilsesquioxane Random Copolymer 51.04 g (0.10 moles) of 1H,1H,2H,2H-perfluorooctyltriethoxysilane, 73.31 g (0.30 moles) of diphenyldimethoxysilane, 88.49 g (0.30 moles) of triethoxy[3-[(3-ethyl-3-oxetanyl)methoxy]propyl]silane, and 70.32 g (0.30 moles) of trimethoxyoctylsilane were added to a 2-L flask with a funnel, a cooling tube, and a stirrer, 200 g of propylene glycol monomethyl ether acetate was weighed and added thereto, and while the resulting solution was stirred, a mixture of 3.01 g (0.1 moles) of an aqueous 35% HCl solution and 60 g of ultrapure water was slowly added dropwise thereto. At this time, the temperature was maintained such that an exothermic temperature did not exceed 50° C. After dropwise addition, the reaction temperature was raised to 90° C., followed by stirring for 24 hours.

After the reaction was completed, distilled water was added to the reaction product to recover an organic phase through phase separation and a residual solvent and residual moisture were removed by evaporation to obtain 90 g of a polysilsesquioxane copolymer resin. The obtained copolymer resin was dissolved in 500 g of propylene glycol monomethyl ether acetate.

FIG. 1 illustrates a weight average molecular weight of the polysilsesquioxane random copolymer prepared according to Synthesis Example 1, and as a result of GPC measurement, the copolymer resin had a polydispersity index (PDI) of 2.05 and a weight average molecular weight ($M_w$) of 7,500.

Example 1

Preparation of Polysilsesquioxane-Based Resin Composition 100 wt % (as a percentage of solids) of the polysilsesquioxane random copolymer resin solution prepared according to Synthesis Example 1, 20 wt % (as a percentage of solids) of octa-epoxycyclohexylethyl polysilsesquioxane (manufactured by Hybridplastics, Cage-type), 3 wt % of 1,2,4-benzenetricarboxylic acid as a curing agent, and 0.5 wt % of a silicon-based surfactant were diluted and dissolved in propylene glycol monomethyl ether acetate as a diluting solvent such that a solid content of the resulting composition was 30 wt %, followed by filtration with a PTFE membrane filter with a pore size of 0.1 μm, thereby obtaining a liquid resin composition.

Example 2

A liquid resin composition was prepared in the same manner as in Example 1, except that octa-glycidyl polysilsesquioxane (manufactured by Hybridplastics, Cage-type) was used instead of octa-epoxycyclohexylethyl polysilsesquioxane.

Example 3

A liquid resin composition was prepared in the same manner as in Example 1, except that octa-maleic polysilsesquioxane (manufactured by Hybridplastics, Cage-type) was used instead of octa-epoxycyclohexylethyl polysilsesquioxane.

Comparative Example 100 wt % (as a percentage of solids) of poly(pyromellitic dianhydride-co-4,4'-oxydianiline), amic acid solution, available from Sigma-Aldrich instead of the synthetic resin solution of the present invention, and 0.5 wt % of a silicon-based surfactant were diluted and dissolved in propylene glycol monomethyl ether acetate as a diluting solvent such that a solid content of the resulting composition was 30 wt %, followed by filtration with a PTFE membrane filter with a pore size of 0.1 μm, thereby obtaining a liquid resin composition.

Physical properties of the resin compositions prepared according to the examples and the comparative example were evaluated as described below, and the evaluation results thereof are shown in Table 1 below.

1. Formation of Coating Film

Each liquid resin composition was spin-coated on a silicon wafer or a glass substrate at 500 rpm to form a coating film, and then subjected to soft baking on a hot plate at 100° C. for 120 seconds, and the thickness of each coating film was measured using an optical thickness measuring device (Product Name: ST-4000 manufactured by K-MAC), and as a result of measurement, each coating film had a thickness of 10 μm.

2. Evaluation of Cracks

Each obtained coating film was subjected to primary heating in an oven at 250° C. for 30 minutes to cure the coating film, followed by secondary heating at 300° C. for 30 minutes and observation using an optical microscope, and for the observation results, no cracks were determined as "excellent," and the occurrence of cracks was determined as "poor."

3. Evaluation of Film Remaining Ratio

A film remaining ratio was calculated by Equation 1 below:

Film remaining ratio (%)=(Film thickness after curing at 250° C. for 30 minutes/initial film thickness)×100  <Equation 1>

4. Heat Resistance Evaluation

Each coating film was subjected to primary curing at 250° C. for 30 minutes and then secondary heating at 300° C. for 30 minutes and transmittance thereof was measured. The transmittance was measured using an UV/Vis spectrometer (300 nm to 800 nm average transmittance) and for the measurement results, 95% or more was determined as "excellent," 90% to 95% was determined as "normal," and less than 90% was determined as "poor."

5. Chemical Resistance Evaluation

After forming each coating film, a curing process was performed thereon at 250° C. for 30 minutes, followed by immersion in a PR stripping solution (Product Name: LT-360) at 40° C. for 10 minutes, and then a swelling variation rate of a film thickness was calculated. A swelling variation rate of less than 5% was determined as "excellent," and a swelling variation rate of 5% or more or the case of a reduction in film thickness was determined as "poor."

6. Dielectric Constant Evaluation

A coating film was formed on an ITU substrate, followed by a curing process, and then an aluminum electrode having a diameter of 1.0 mm was deposited thereon, thereby completing the manufacture of a metal-insulator-metal (MIM) evaluation cell. To measure a dielectric constant, an electrostatic capacity (C) of the coated resist film of the MIM evaluation cell was measured using an LCR-meter (4284 manufactured by Agilent), and the dielectric constant thereof was obtained by Equation 2 below:

$C=(\varepsilon_0 \varepsilon A)/d$  <Equation 2> wherein d=thickness of cured film,

A=area of deposited electrode, $\varepsilon_0$ denotes a constant and is a dielectric constant of a vacuum (8.855×10−12 F/m), and $\varepsilon$ is a dielectric constant to be obtained for the coating film.

7. Moisture Absorption Evaluation

After forming each coating film, a curing process was performed thereon, followed by immersion in distilled water at room temperature for 72 hours, and then a swelling variation rate of a film thickness was calculated. A swelling variation rate of less than 2% was determined as "excellent," and a swelling variation rate of 2% or more was determined as "poor."

8. Contact Angle Measurement

After forming each coating film, a curing process was performed thereon at 250° C. for 30 minutes, DI droplets were dropped on a surface of each coating film, and a contact angle thereof was measured. A contact angle of 80° or more was determined as "excellent," and a contact angle of less than 80° was determined as "normal."

TABLE 1

| | Cracks | Film remaining ratio (%) | Heat resistance (Loss wt %) | Chemical resistance | Dielectric constant | Moisture absorption (%) | Contact angle |
|---|---|---|---|---|---|---|---|
| Example 1 | Excellent | 91 | Excellent | Excellent | 3.25 | Excellent | Excellent |
| Example 2 | Excellent | 90 | Excellent | Excellent | 3.24 | Excellent | Excellent |
| Example 3 | Excellent | 88 | Excellent | Excellent | 3.25 | Excellent | Excellent |
| Comparative Example | Excellent | 75 | Poor | Poor | 3.44 | Poor | Normal |

As can be shown in Table 1, a highly transparent and highly heat-resistant liquid coating composition for a flexible substrate, which used the polysilsesquioxane resin composition consisting of a mixture of the compounds of Formulae 1 and 2 and a curing agent, according to the present invention, exhibited excellent transparency, excellent heat resistance, a very high film remaining ratio, and very high chemical resistance, unlike conventional substrates using polyimides.

In addition, a transparent coating film formed of the composition of the present invention exhibited low-dielectric characteristics and low moisture absorption compared to the case of the comparative example, and thus when used as a flexible substrate, excellent device reliability can be expected, and the transparent coating film is effective in stain resistance or delamination from a glass substrate due to a high contact angle thereof. Thus, the coating film obtained from the resin composition of the present invention can be usefully used as an interlayer insulating film of a liquid crystal display device, and a material for an organic EL display device, a flexible display, or a touch panel.

INDUSTRIAL APPLICABILITY

The present invention relates to a polysilsesquioxane resin composition for a flexible substrate. More particularly, the present invention relates to a polysilsesquioxane resin composition for a flexible substrate which has excellent heat resistance and excellent transparency, as a resin composition that can be used for a substrate of a flexible display.

The invention claimed is:

1. A polysilsesquioxane resin composition comprising:
a polysilsesquioxane random copolymer represented by Formula 1 below:

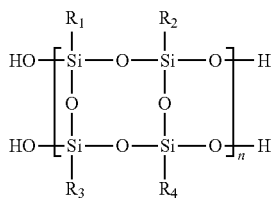

<Formula 1> wherein n is an integer of 2 to 100, and $R_1$ is one or more selected from the group consisting of trifluoromethyl, perfluoropropyl, perfluorohexyl, perfluorooctyl, and perfluorodecyl;

$R_2$ is one or more selected from the group consisting of propyl, hexyl, octyl, and decyl;

$R_3$ is one or more selected from the group consisting of $C_{6-18}$ aryl groups; and $R_4$ is 3-[(3-ethyl-3-oxetanyl)methoxy]propyl;
and
a compound represented by Formula 2 below:
an organic solvent; and
a crosslinking agent:

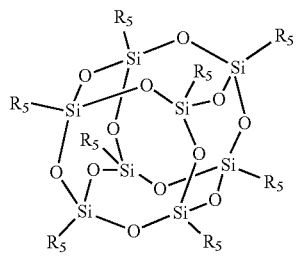

<Formula 2> wherein $R_5$ is epoxycyclohexylethyl.

2. The polysilsesquioxane resin composition of claim 1, wherein the crosslinking agent is any one or more selected from the group consisting of a melamine-based compound, an acid anhydride-based compound, an isocyanate-based compound, an amine-based compound, an imidazole-based compound, a phenol-based compound, a hydroxyl-based compound, a carboxyl-based compound, and a mixture thereof.

3. The polysilsesquioxane resin composition of claim 2, wherein the crosslinking agent is one or more selected from the group consisting of dicyandiamide, melamine, pyromellitic dianhydride, cyclobutane-1,2,3,4-tetracarboxylic dianhydride, 1,4,5,8-naphthalenetetracarboxylic dianhydride, benzophenone-3,3',4,4'-tetracarboxylic dianhydride, 3,3',4,4'-biphenyltetracarboxylic dianhydride, bicyclo[2.2.2]oct-7-ene-2,3,5,6-tetracarboxylic dianhydride, 1,2,4-benzenetricarboxylic acid, 4,4'-(9-fluorenylidene)diphenol, 4,4'-(1,3-adamantanediyl)diphenol, 4,4'-(hexafluoroisopropylidene)diphenol, and 4,4'-dihydroxybiphenyl.

4. The polysilsesquioxane resin composition of claim 1, wherein the organic solvent is any one or more selected from the group consisting of diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, methyl isobutyl ketone, cyclohexanone, N-methyl-2-pyrrolidone (NMP), ethylene glycol dimethyl ether, diethylene glycol methyl ether, diethylene glycol ethyl ether, and dipropylene glycol methyl ether.

5. The polysilsesquioxane resin composition of claim 1, wherein the polysilsesquioxane resin composition comprises 5 wt % to 50 wt % of a polysilsesquioxane random copolymer represented by Formula 1, 1 wt % to 30 wt % of a compound represented by Formula 2, 1 wt % to 10 wt % of a crosslinking agent, and 10 wt % to 92.9 wt % of an organic solvent.

6. The polysilsesquioxane resin composition of claim 1, further comprising a surfactant and a glycol-based solvent.

7. An interlayer insulating film comprising the polysilsesquioxane resin composition according to claim 1.

8. A planarizing film comprising the polysilsesquioxane resin composition according to claim 1.

9. A passivation insulating film comprising the polysilsesquioxane resin composition according to claim 1.

10. A material for a substrate, the material comprising the polysilsesquioxane resin composition according to claim 1.

* * * * *